Aug. 18, 1959 R. E. HOWES 2,900,533
MULTIPLE DELAY LINE
Filed July 2, 1957

INVENTOR:
Royal E. Howes
By Louis A. Kline
John J. Matlago
His Attorneys

United States Patent Office 2,900,533

Patented Aug. 18, 1959

2,900,533

MULTIPLE DELAY LINE

Royal E. Howes, Inglewood, Calif., assignor to The National Cash Register Company, Dayton, Ohio, a corporation of Maryland Application July 2, 1957, Serial No. 669,653

5 Claims. (Cl. 307—88.5)

This invention relates to pulse delay lines and more particularly to a circuit arrangement for increasing the delay period of a standard delay line.

When designing delay lines having relatively long delay periods and especially when it is desired to pass pulses through the delay line comprising waveforms having fast rise times, which characteristically require a large number of sections, e.g., capacitors and inductors, the cost of the line increases appreciably as the delay period increases. The circuit of the present invention makes it possible to obtain a delay period which is a multiple of the period for which a delay line is normally designed, by utilizing the reflection characteristics of pulses passing through the delay line. At the same time, the circuit of the present invention enables the quality of the pulse, as measured by its rise time, for example, to be maintained equivalent to that obtained from a standard delay line designed to have the multiple delay period.

One of the objects of this invention is to provide a standard delay line with input and output circuits which functions to multiply the time that a pulse introduced into the input circuit is delayed before being sensed at the output circuit.

Another object of this invention is to increase the period of a delay line by providing circuitry for causing a pulse introduced into the line to be reflected back and forth between the ends of the line prior to being sensed at the output.

Briefly, the circuit of the present invention comprises a conventional delay line provided with an input switching transistor and an output switching transistor. Upon biasing the input switching transistor into conduction, a positive pulse is fed into the delay line. A forward biased diode connecting the output of the delay line to a negative potential effectively functions as a short circuit in response to the positive pulse reaching the output of the delay line, causing this pulse to be reflected in inverted form back through the delay line. The negative pulse so reflected back through the delay line is then reflected again upon arriving at the beginning of the line, only this time without inversion, as a result of the input switching transistor being biased to an open circuit. As this reflected negative pulse arrives at the output of the delay line for the second time, the diode is now back biased such that the pulse is impressed upon the base of the output switching transistor causing it to conduct and pass an output pulse through a level referencing circuit to an output terminal. The impedance to the current through the base of the output switching transistor when conducting, is designed to match the characteristic impedance of the delay line to thereby prevent further reflections of the signal. Thus the positive input pulse is delayed three times the normal characteristic delay period of the delay line before momentarily biasing the output switching transistor into conduction to provide the output pulse.

These and other features of this invention, as well as additional objects thereof, will become more apparent by reference to the ensuing description and accompanying drawings in which.

Figures 1, 2:
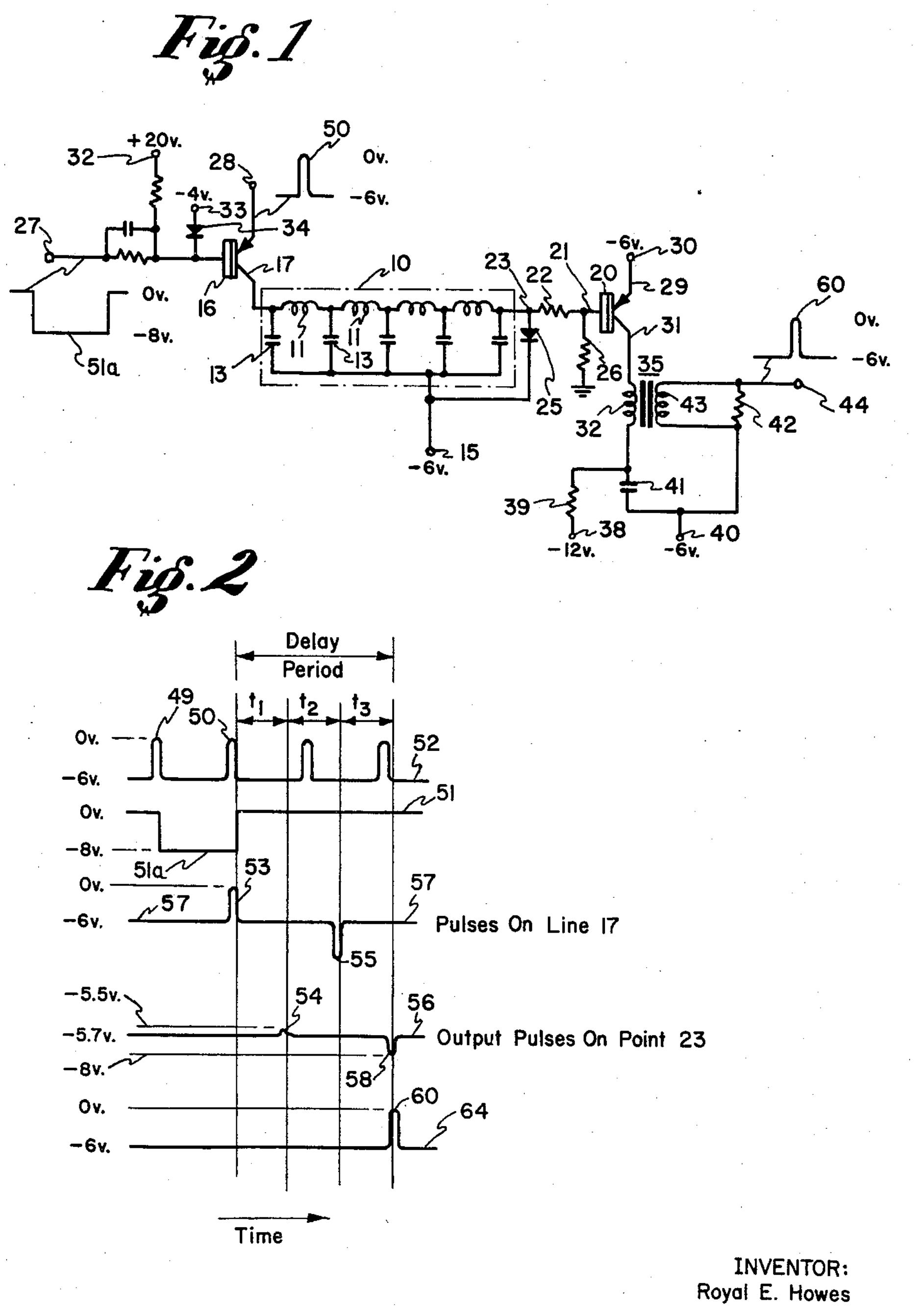
Fig. 1 is a schematic diagram of a preferred embodiment of the invention.
Fig. 2 is a graph of the pulses taken at various points of the circuit.

Referring first to Fig. 1, a delay line 10 of the lumped parameter type functions to provide a predetermined time delay to a signal passing from the input to the output thereof. The delay line 10 comprises a plurality of inductors 11 connected in series, with delay capacitors 13 coupling a tap at the end of each inductor 11 to −6 volt terminal 15. Input transistor 16, which is connected in a grounded base configuration for good frequency response, has its emitter connected to terminal 28 and its collector line 17 connected to the input of delay line 10. A control terminal 27 is connected by way of a current limiting resistor and parallel capacitor to the base of input transistor 16. The base of input transistor 16 is also connected to +20 volt biasing terminal 32 and is clamped to −4 volt terminal 33 by way of appropriately poled diode 34.

The output of delay line 10 is connected by way of resistor 22 to the base of an output transistor 20. The output of delay line 10 is also connected at point 23 to −6 volt terminal 15 by way of a diode 25, so poled that it is biased in the forward direction by a potential above −6 volts appearing at point 23. Base 21 of output transistor 20 is also connected by way of resistor 26 to ground potential to provide a source of biasing current for diode 25. Emitter 29 of transistor 20 is connected to −6 volt terminal 30 and collector 31 is connected to one end of primary winding 32 of transformer 35. The other end of primary winding 32 is connected by way of resistor 39 to −12 volt terminal 38 and is also coupled to −6 volt terminal 40 by way of capacitor 41. Capacitor 41 acts to maintain the −12 volt level for forming pulse 60, while resistor 39 protects primary winding 32 from burning out if transistor 20 should become short circuited. Secondary winding 43 of transformer 35 is connected between −6 volt terminal 40 and output terminal 44, and output resistor 42 is connected across secondary winding 43 to damp spurious oscillations of transformer 35.

In operation, when a positive clock pulse 50 is applied on the emitter of input switching transistor 16 during the time that a negative control pulse 51*a* is present on control terminal 27 connected to the base line of transistor 16, pulse 50 is gated onto collector line 17. This positive pulse 50 passes through delay line 10 and, after the predetermined delay time, arrives at point 23. Diode 25 is normally biased in a forward direction by a current passing from ground through resistors 26 and 22 and through diode 25 to −6 volt terminal 15 in order to maintain diode 25 in a region of low dynamic impedance, thus presenting a more perfect short circuit. When this positive pulse 50 travels through delay line 10 to point 23, it senses this short circuit through diode 25 to −6 volt terminal 15 which causes the positive pulse to be inverted about the approximately −6 volt potential level and reflected back through delay line 10, as a negative pulse. This reflected negative pulse passes back through delay line 10, with the predetermined delay time, to collector line 17 of transistor 16 which is now an open circuit because of control pulse 51*a* on the base thereof having risen to its high potential. This open circuit condition causes this negative pulse to be reflected again through delay line 10. For this reflection, however, because of sensing the open circuit of transistor 16, the pulse is not inverted. This reflected negative pulse, after the predetermined delay time, reaches the output of delay line 10 at point 23 and causes diode 25 to be back biased so as not to present a closed circuit to the pulse, as in the first pass through delay line 10. At the same time, this negative pulse appears on base 21 of output transistor 20 biasing it to a conducting state. Since the terminating impedance at the current through output transistor 20 is designed to match the impedance of delay 10, this negative pulse is not reflected again. The momentary biasing of transistor 20 to a conducting state causes a positive pulse to pass from —6 volt terminal 30 through transistor 20 and through primary winding 32 of transformer 35 to the —12 volt charge of capacitor 41. Thus this positive pulse appears on secondary winding 43 and is passed to output terminal 44 as positive pulse 60 referenced to the —6 volts of terminal 40. It should now be understood that clock pulse 50 has passed through standard delay line 10 three times, to give a delay period of three times the characteristic delay of delay line 10, before biasing transistor 20 into conduction.

Referring now also to Fig. 2, which is a graph of the waveforms taken at the various points of the circuit of Fig. 1, the operation of the invention will be explained in further detail. Delay periods $t_1$, $t_2$ and $t_3$ each represent the predetermined delay period of delay line 10 which is multiplied three times by reflection of the pulses to form the total period by which a pulse introduced into the delay line 10 is delayed. Waveform 51 shows the negative control pulse **51*a* impressed upon terminal 27 connected to the base of transistor 16, and waveform 52 shows the clock pulses introduced at terminal 28 connected to the emitter of transistor 16**.

It is to be noted that control pulse **51*a* of waveform 51 falls to —8 volts upon the fall of clock pulse 49 and rises to 0 volts upon the fall of clock pulse 50. The control pulse of waveform 51 which has logical levels of 0 and —8 volts may be formed in computer logical circuitry, for example, which is controlled by the fall of the clock pulses of waveform 52. When control pulse 51*a* of the waveform 51 impressed on terminal 27 falls toward —8 volts, the potential on the base of transistor 16 is clamped at the —4 volt level of terminal 33 in order to prevent transistor 16 from being biased into conduction by the —6 volt level of waveform 52**.

As previously noted, clock pulse 50 of waveform 52 illustrates an input pulse which is to be gated from the emitter to the collector of input transistor 16 when the latter is biased to conduct. When clock pulse 50 of waveform 52 rises to 0 volts, prior to period $t_1$, transistor 16 is biased into conduction since the control pulse of waveform 51 is at its low potential, and pulse 53 of waveform 57, having an amplitude of 6 volts, appears on line 17 and passes through delay line 10. Then at the beginning of period $t_1$ control pulse **51*a* of waveform 51 rises to 0 volts and biases transistor 16 into a non-conducting condition. Current then passes from +20 volt terminal 32 into terminal 27 to hold the potential at the base of transistor 16 at approximately +2 volts to prevent subsequent clock pulses of waveform 52 on terminal 28 from passing through transistor 16**, in event the clock pulses should vary above 0 volts.

Pulse 54 of waveform 56 at the end of period $t_1$ shows the voltage signal at point 23 after pulse 53 passes through delay line 10 and senses the short circuit through diode 25. The normal potential at point 23 is —5.7 volts as a result of the current passing through resistors 26 and 22 and through diode 25 to —6 volts of terminal 15. The amplitude of pulse 54 at point 23 is +.2 volts which represents the increased potential drop across diode 25 due to the positive pulse passing through to the —6 volt terminal 15. The positive current pulse which passes through the short circuit path of diode 25 causes an inverted pulse to be formed and reflected back through delay line 10. This inverted and reflected pulse appears at the end of period $t_2$ on collector line 17 as the negative pulse 55 of waveform 57. Negative pulse 55 has an amplitude similar to input pulse 53 except for losses introduced while passing through delay line 10 and diode 25. After reflecting back for the third pass through delay line 10, negative pulse 55 appears at the end of period $t_3$ at point 23 as the negative pulse 58 of waveform 56 with a low level of approximately —8 volts. The —8 volts of pulse 58 back biases diode 25 thus presenting an open circuit to pulse 58. Pulse 58 is passed to the base of switching transistor 20, thus transistor 20 is momentarily biased to conduct from —6 volt potential of terminal 30 to form a pulse on the collector 31.

The impedance of the current path through conducting transistor 20 from terminal 30 to base 21 and through resistor 22, which comprise the terminating load, is designed to match the impedance of delay line 10. Thus since the whole of the energy in delay line 10 is absorbed in this terminating load, no reflection occurs.

When transistor 20 is momentarily biased into conduction by pulse 58 passing to base 21, a pulse of approximately —6 volt amplitude is passed through transistor 20 onto line 31, which is normally at a —12 volt level. This pulse on line 31 passes through primary winding 32 and secondary winding 43 of transformer 35 to appear at terminal 44 as the positive output pulse 60 of waveform 64 which is of 0 volts peak amplitude above the —6 volt reference potential of terminal 40. Thus transformer 35 references the output pulse to —6 volts to be consistent with the input clock pulses of waveform 52.

Therefore, the circuit of this invention delays clock pulse 50 of waveform 52 to form pulse 58 at the output of delay line 10 for a total delay period of three times the normal period of delay line 10, or the sum of periods $t_1$, $t_2$ and $t_3$.

It is to be noted that in the preferred embodiment, the inverted pulse 60 at terminal 44 is delayed slightly beyond the end of period $t_3$ by the slow response of output transistor 20 which is in a grounded emitter arrangement and transformer 35 which references the output pulse 60. However, this slight delay at the output can be calculated to obtain a desired delay period. Also, the delay period of a standard delay line can be adjusted by adding or deleting sections, as well known in the art. It is to be further noted that this invention is applicable to other types of delay lines, and is not restricted to utilizing the lumped parameter type of the preferred embodiment.

While the form of the invention shown and described herein is admirably adapted to fulfill the objects primarily stated, it is to be understood that it is not intended to confine the invention to the one form or embodiment disclosed herein, for it is susceptible of embodiment in various other forms.

What is claimed is:

1. A pulse delay circuit comprising: a delay device having a first and a second terminal; an input line for receiving a positive input pulse to be delayed; input switching means controlled to pass a positive pulse from said input line onto the first terminal of said delay device, and to reflect a negative pulse reflected back through the delay device from the second terminal; a diode connected to the second terminal of said delay device to cause a positive pulse sensed thereon to be reflected back through the delay device as a negative pulse and to present a substantially infinite impedance to a negative pulse sensed thereon to thereby permit the passage of said negative pulse; an output line; and, output switching means having a characteristic impedance which matches the characteristic impedance of said delay line and connected to be controlled by a negative pulse on the second terminal of said delay device to pass a pulse onto said output line.

2. A pulse delay circuit comprising: a delay line having an input and output, said delay line having a fixed delay period; a source of positive pulses, input gating means controlled to provide an open circuit after passing a positive pulse from said source into the input of said delay line; a diode connected to the output of said delay line to present a short circuit to a positive pulse sensed thereon, thereby causing a negative pulse to be reflected back through the delay line, said negatve pulse being reflected again back into the delay line upon sensing the open circuit provided by the input gating means; and an output gating means for responding to the reflected negative pulse appearing on the output of the delay line, to thereby provide an output pulse which is delayed with respect to the positive input pulse a period equal to three times the fixed delay period of said delay line.

3. An electrical circuit for tripling the effective length of a delay line comprising: a delay line having an input and an output terminal; input gating means for connecting a pulse of a given polarity to the input terminal of said line; output gating means for terminating the output terminal of said line in its characteristic impedance including means adapted to present at said output terminal a short circuit to a pulse of said given polarity to thereby invert and reflect it back to the input terminal, said input gating means at said input terminal adapted to present an open circuit to a pulse of polarity opposite to said given polarity thereby reflecting it back along the delay line to said output terminal, and said means at said output terminal further adapted to permit the passage of said pulse of polarity opposite to said given polarity to said output gating means, whereby a pulse applied to the input terminal of the delay line causes a pulse to pass from the output terminal thereof to said output gating means after a delay period equal to three times the delay of a single traverse of a pulse along said line.

4. An electrical time delay device comprising: a delay line having input and output terminals; a source of pulses of a given polarity; input means connected to said input terminal for passing pulses from said source into said delay line; an output circuit connected to said output terminal, said output circuit having an impedance which matches the characteristic impedance of said delay line to pulses of polarity opposite to said given polarity; terminating means including a unilateral impedance means connected to said output terminal, said unilateral impedance means being adapted to prevent a short circuit to pulses of said given polarity to thereby invert and reflect them back to the input terminal of the delay line, said input means being adapted to present an open circuit to pulses reflected from said output terminal to thereby reflect them back along said line to said output terminal, and said unilateral means being further adapted to permit the passage of said pulses of polarity opposite to said given polarity to said output circuit, whereby a pulse applied at the input terminal of the delay line traverses said line three times prior to being passed to said output circuit.

5. An electrical circuit for tripling the effective length of a delay line comprising: a delay line having an input and an output terminal; gating means for connecting a source of pulses to the input terminal of said line; output means terminating the output terminal of said line in its characteristic impedance including a first means having an output lead and a second means at said output terminal adapted to present at said output terminal a short circuit to said pulses to thereby cause inverted reflected pulses to travel back along said line to the input terminal, said gating means at said input terminal adapted to present an open circuit to said reflected pulses to thereby cause them to again travel along said line to said output terminal, and said second means at said output terminal further adapted to permit the passage of said reflected pulses to the output lead of said first means; whereby pulses applied to the input terminal of the delay line are passed from the output terminal thereof onto the output lead of said first means after a period equal to substantially three times the delay period of a single traverse of a pulse along said line.

References Cited in the file of this patent

UNITED STATES PATENTS

| | | |
|---|---|---|
| 2,631,232 | Barocket | Mar. 10, 1953 |
| 2,691,727 | Lair | Oct. 12, 1954 |
| 2,729,793 | Anderson | Jan. 3, 1956 |